United States Patent [19]
Popovic et al.

[11] Patent Number: 5,942,895
[45] Date of Patent: Aug. 24, 1999

[54] MAGNETIC FIELD SENSOR AND CURRENT AND/OR ENERGY SENSOR

[75] Inventors: Radivoje Popovic; Robert Racz; Jan Hrejsa, all of Zug; Hubert Blanchard, Rue de 1'Hôtel de Vevey, all of Switzerland

[73] Assignee: Sentron AG, Switzerland

[21] Appl. No.: 08/734,948

[22] Filed: Oct. 23, 1996

[30] Foreign Application Priority Data

Oct. 30, 1995 [CH] Switzerland .......................... 03062/95

[51] Int. Cl.$^6$ ............................. G01R 33/06; G01R 19/00
[52] U.S. Cl. ...................................... 324/251; 324/117 H
[58] Field of Search .............................. 324/251, 207.2, 324/235, 117 H, 127; 338/32 H

[56] References Cited

U.S. PATENT DOCUMENTS

| | | | |
|---|---|---|---|
| 3,164,013 | 1/1965 | Schmahl et al. | 324/251 |
| 3,344,347 | 9/1967 | Stevens | 324/251 |
| 3,425,648 | 2/1969 | Wipff et al. | 324/251 |
| 3,885,212 | 5/1975 | Herbert | 324/117 H |
| 4,733,177 | 3/1988 | Pawletko | 324/251 |
| 4,749,939 | 6/1988 | Seitz | 324/117 H |
| 5,057,890 | 10/1991 | Falk et al. | 324/252 |
| 5,493,216 | 2/1996 | Asa | 324/207.2 |

*Primary Examiner*—Ernest F. Karlsen
*Attorney, Agent, or Firm*—Proskauer Rose LLP

[57] ABSTRACT

A magnetic field sensor has two flux concentrators which serve to strengthen a magnetic field to be measured and which are separated by an air gap. Two Hall elements are arranged outside the air gap in such a way that at least a part of the field lines which lead from the first to the second flux concentrator pass through the two Hall elements in approximately opposite directions. Such a magnetic field sensor is less sensitive to external interference fields. It is suitable for the measurement of very weak magnetic fields and also for use as a current and/or energy sensor.

2 Claims, 4 Drawing Sheets

5,942,895

MAGNETIC FIELD SENSOR AND CURRENT AND/OR ENERGY SENSOR

BACKGROUND OF THE INVENTION

1. Field of the Invention

The invention concerns a magnetic field sensor of the kind having two flux concentrators and a sensor for measuring a magnetic field, wherein the flux concentrators are separated by an air gap.

2. Description of the Prior Art

U.S.-american patent specification U.S. Pat. No. 474 9939 discloses a magnetic field sensor for measuring the energy transported through an electric conductor. The magnetic field sensor has a vertical Hall element and two magnetic flux concentrators. The flux concentrators and an external yoke form a magnetic circuit of ferromagnetic material, in the air gap of which the Hall element is disposed.

The flux concentrators are of a configuration such as to reduce in width towards the Hall element in order to produce a magnetic field which is as high as possible in the air gap in relation to the current flowing in the conductor, and thus to achieve a high level of sensitivity. The geometry of the flux concentrators is optimised in such a way that the magnetic flux outside the air gap, that is to say the leakage field component, is as small as possible so that the linearity of the magnetic field sensor is not adversely affected by saturation effects of the flux concentrators. The minimum possible width of the air gap is limited in a downward direction by the dimensions of the Hall element disposed in the air gap.

Although it is possible with horizontal Hall elements further to reduce the dimensions of the air gap, as however the flux concentrators in principle must be of a different configuration in order to pass the magnetic field through the Hall element, such an arrangement is sensitive to interference fields which act on the Hall element in a perpendicular direction.

SUMMARY OF THE INVENTION

The object of the present invention is to propose a magnetic field sensor for measuring weak magnetic fields, which has a high level of accuracy and which is less sensitive to interference fields.

According to a first aspect, the present invention provides a magnetic field sensor having two flux concentrators and a sensor for measuring a magnetic field, wherein the flux concentrators are separated by an air gap, and wherein two Hall elements serve as the sensor, the Hall elements being arranged outside the air gap and at least a part of the field lines of the magnetic field, which lead from the first flux concentrator to the second flux concentrator, passes through the two Hall elements in approximately opposite directions.

According to a second aspect, the present invention provides a magnetic field sensor having two flux concentrators and a Hall element for measuring a magnetic field, wherein the flux concentrators are separated by an air gap, and wherein the Hall element is arranged outside the air gap and at least a part of the field lines of the magnetic field, which lead from the first flux concentrator to the second flux concentrator, passes through the Hall element in approximately opposite directions.

Advantageous configurations are set forth in the appendant claims.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
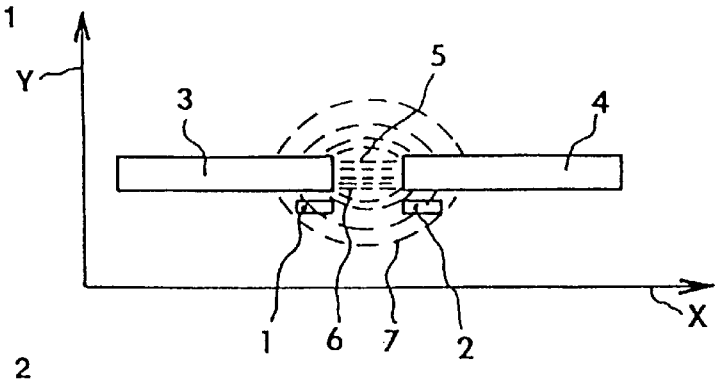
FIG. 1 is a view of a magnetic field sensor in cross-section.

FIG. 1 which is not to scale shows in cross-section in a xy-plane a magnetic field sensor which includes two horizontal Hall elements 1, 2 and two magnetic flux concentrators 3, 4 for strengthening a magnetic field B which is in the direction x. The two flux concentrators 3 and 4 are separated by an air gap 5. The geometrical configuration of the field lines of the magnetic field B in the region of the air gap 5 is represented by broken lines 6, 7. The two Hall elements 1 and 2 are arranged outside the air gap 5. The geometrical dimensions of the flux concentrators 3, 4 and their spacing which defines the air gap 5 are so selected that the component of the field lines 7 which do not lead directly through the air gap 7 is as large as possible, in comparison with the field lines 6 which lead through the air gap 5. In addition the geometrical dimensions of the flux concentrators 3, 4 are so selected that saturation effects occur by virtue of their magnetic properties with a field strength of the magnetic field B which is as large as possible at the location of the Hall elements 1, 2.

The Hall element 1 has field lines 7 passing therethrough, which issue from the first flux concentrator 3 in the vicinity of the air gap 5, while the Hall element 2 has field lines 7 passing therethrough, which impinge on the second flux concentrator 4 in the vicinity of the air gap 5. In an ideal arrangement each flux line 7 passes through either both or neither of the Hall elements 1 and 2. As the magnetic permeability of the flux concentrators 3, 4 is selected to be greater than the permeability of air at least by a factor of $10^3$, the field lines 6, 7 leave the flux concentrators 3, 4 at an approximately perpendicular angle. Accordingly, when the magnetic field B is in the positive x-direction the field lines 7 which pass through the Hall element 1 face approximately in the negative y-direction (FIG. 1), while the field lines 7 which pass through the Hall element 2 point in the positive y-direction. That symmetrical arrangement thus makes it possible for interference fields in the y-direction not to be measured. The dimensions of the flux concentrators 3, 4 in the xz-plane are typically some tenths of a millimeter, while the thickness in the xy-plane is typically some 10 micrometers. The air gap 5 measures for example 50 micrometers. That arrangement provides that the air gap 5 is independent of the dimensions of the Hall element.

Figure 2:
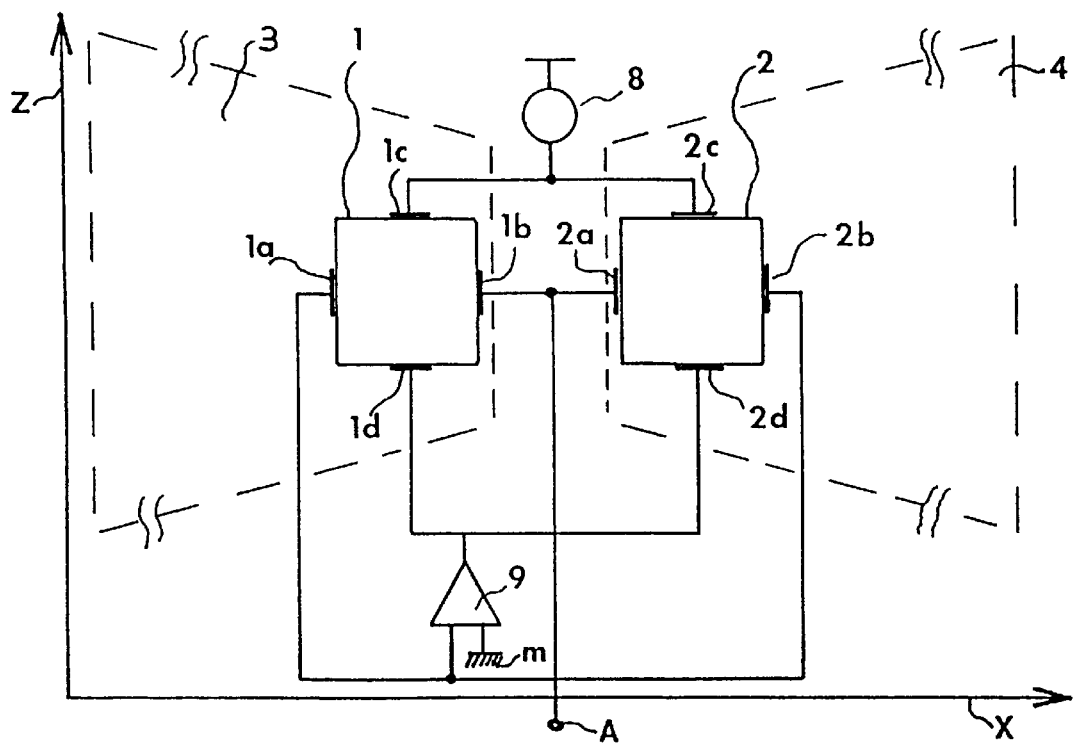
FIG. 2 is a plan view of the magnetic field sensor in a first embodiment with two Hall elements.

FIG. 2 shows in a xz-plane which is perpendicular to the xy-plane the two Hall elements 1, 2 in a conventional configuration each having two voltage electrodes 1a, 1b and 2a, 2b respectively and two current electrodes 1c, 1d and 2c, 2d respectively, the two flux concentrators 3, 4 and the electrical circuitry of the Hall elements 1, 2. The diagrammatically illustrated Hall elements 1, 2 are electrically connected in parallel and are fed with a current from a common current source 8. The voltage electrodes 1a and 2b of the Hall elements 1, 2 are virtually connected to earth m by means of an operational amplifier. The other two voltage electrodes 1b and 2a respectively of the two Hall elements are connected together and taken to an output A at which the Hall voltage occurs. The Hall elements 1, 2 are so connected that the individual Hall voltages are added when the field lines 7 (FIG. 1) of the magnetic field, which pass therethrough, are opposite in direction. The use of two identical, parallel-connected Hall elements 1, 2 also eliminates systematic offset voltages for example produced by technology-conditioned asymmetries. A current 1 of approximately the same strength and in the same z-direction flows through both Hall elements 1, 2.

Figure 3:
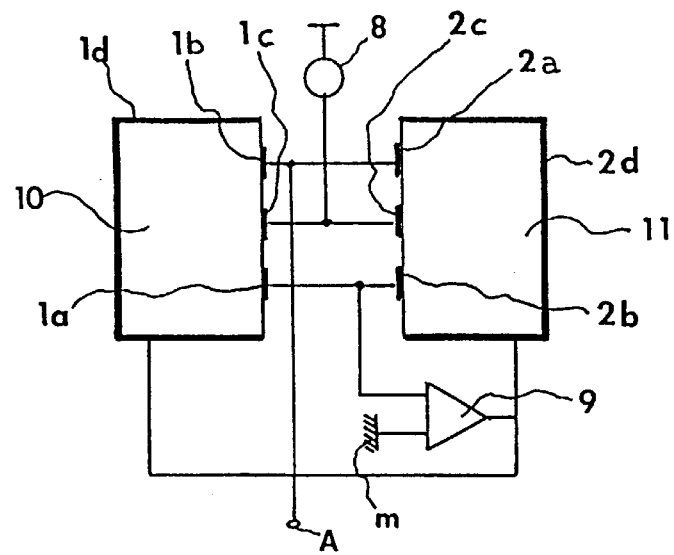
FIG. 3 shows the magnetic field sensor provided with two special Hall elements.

Instead of conventional Hall elements 1, 2 which are of a rectangular geometry and in which a current or a voltage electrode is arranged on each side of the rectangle, it is also possible to use Hall elements in which three or all four electrodes are arranged on one side of the rectangle. Such Hall elements are know from U.S.-american patent specification U.S. Pat. No. 5,057,890. FIG. 3 shows a magnetic field sensor and its electrical circuitry with two such Hall elements 10, 11. The particularity in respect of these rectangular Hall elements 10 and 11 is that the three electrodes 1a, 1b and 1c, 2a, 2b and 2c respectively are disposed on one side of the rectangle and that the fourth electrode 1d and 2d respectively extends along the entire periphery of the other three sides of the rectangle.

Figure 4A:
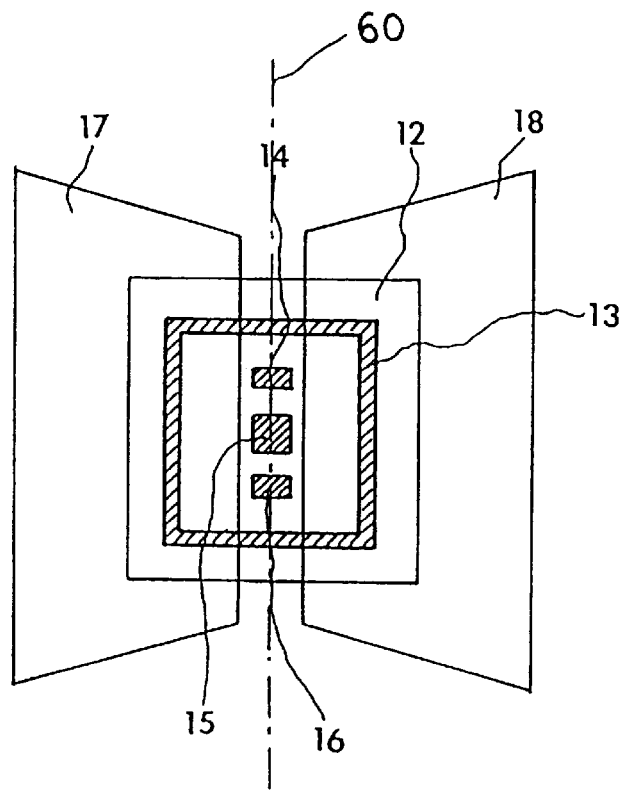
FIGS. 4a and 4b show a plan view of the magnetic field sensor in a second embodiment with a single Hall element.

In a development as shown in FIG. 4a the two Hall elements 10, 11 are merged to form a single Hall element 12, wherein the two original fourth electrodes 1d and 2d form a single annular outer electrode 13 and the respective oppositely disposed electrodes 1b and 2a, 1c and 2c and 1a and 2b come together as inner electrodes 14, 15 and 16. The electrodes 13 and 15 serve as current electrodes while the electrodes 14 and 16 serve as voltage electrodes. The Hall element 12 can be produced for example using CMOS-technology as a n-well in a p-doped substrate. The use of a single mask makes it possible to produce the electrodes 13 to 16 in the form of heavily doped n$^{++}$ islands which define the operative structure of the Hall element 12. Therefore, the Hall element 12 is distinguished by virtue of low offset voltages in the event of careful selection of the geometry and the production procedure involved.

In a development of the magnetic field sensor 1 for measuring particularly small magnetic fields B the Hall element 12 and possibly adjacent surfaces of the chip are covered with structured surface portions 17, 18 of ferromagnetic material such as for example Permalloy or Mumetal. Those surface portions 17, 18 represent flux concentrators, wherein by virtue of the technology involved the geometry of the air gap 5 and also the position of the air gap 5, with respect to the Hall element 12, can be established with a very high degree of accuracy, that is to say micrometer accuracy. The surface portions 17, 18 are of a thickness of from some tenths of a micrometer up to some ten micrometers and are applied for example by sputtering, vapour deposition and/or galvanically. The surface portions 17, 18 can either be combined with the flux concentrators 3, 4 or they can represent flux concentrators which stand alone.

Figure 4B:
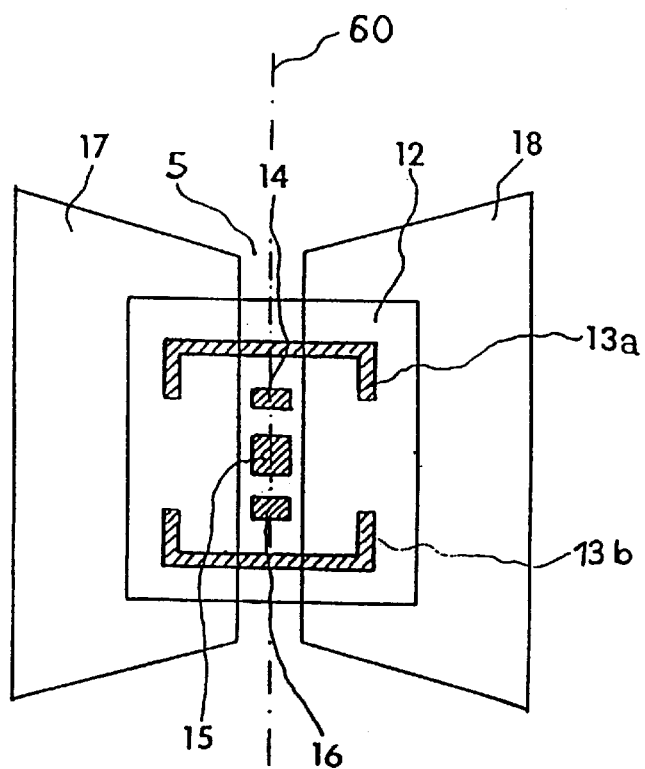

In an alternative configuration as shown in FIG. 4b the outer electrode 13 is divided into two electrodes 13a and 13b which are preferably of a U-shape and whose lateral arms extend to approximately the height of the sensor electrodes 14 and 16 respectively. The electrodes 13a and 13b are electrically short-circuited so that they form a single electrical contact of the Hall element. The electrodes 13a, 14, 15, 16 and 13b are arranged along a notional straight line 60 which extends along the air gap 5 and perpendicularly to the field lines 6 (FIG. 1) of the magnetic field within the air gap 5.

Figure 5A:
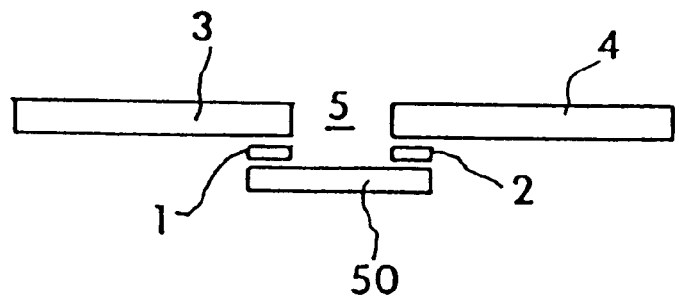
FIGS. 5a and 5b show further magnetic field sensors.
Figure 5B:
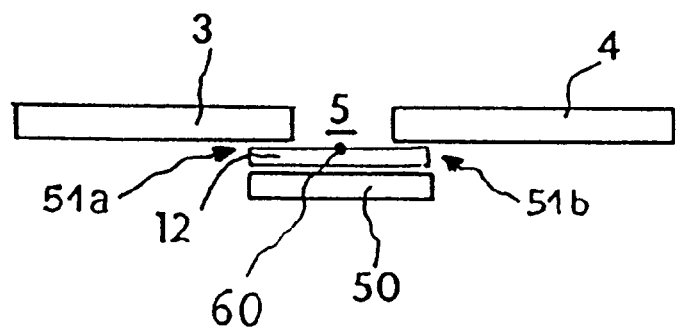

In the case of the magnetic field sensors described above the leakage field is symmetrical with respect to the y-axis. With a further magnetic body 50 which, as shown in FIGS. 5a and 5b, is disposed beneath the Hall elements 1, 2 (FIG. 5a) or the Hall element 12 (FIG. 5b) and symmetrically relative to the air gap, the leakage field component which passes through the Hall elements 1, 2 (FIG. 5a) or the Hall element 12 (FIG. 5b) can be increased in comparison with the field component flowing directly through the air gap 5 and thus the sensitivity of the magnetic field sensor can be enhanced. The air gaps 51a, 51b formed between the flux concentrators 3, 4 and the body 50 are smaller than the air gap 5 so that the magnetic field flowing through the Hall elements 1, 2 or the Hall element 12 is as large as possible in comparison with the magnetic field passing through the air gap 5. If the two Hall elements 1, 2 (FIG. 1) are contained on a single chip or if the Hall element 12 is used, preferably the rear side of the chip or the Hall element 12 is covered with ferromagnetic material which performs the function of the body 50.

Figure 6:
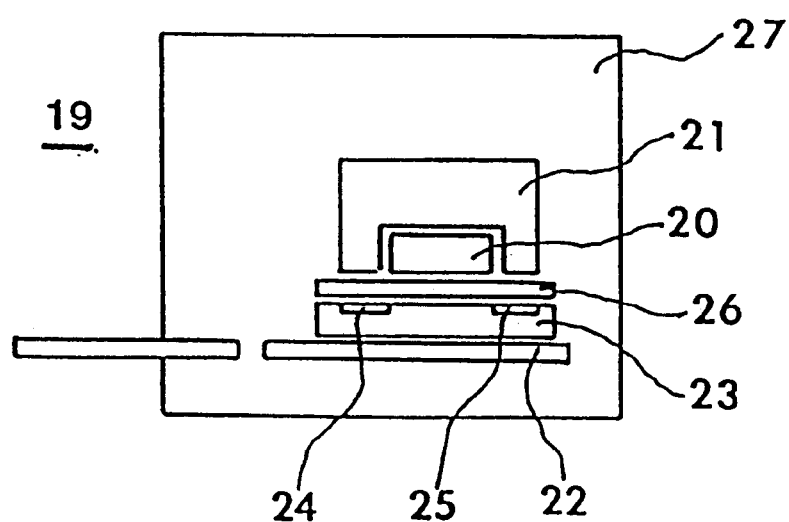
FIG. 6 is a plan view of a current sensor.
Figure 7:
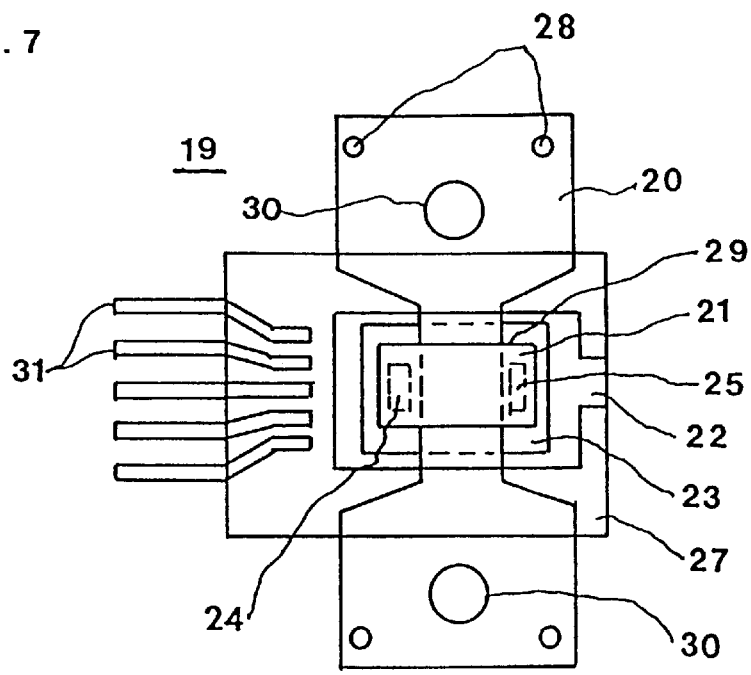
FIG. 7 shows the current sensor in cross-section.

FIGS. 6 and 7 are a plan view and a view in cross-section of a current sensor 19 which is suitable for measuring comparatively small currents of up to typically 20A. The current sensor 19 includes a current conductor 20, a ferromagnetic yoke 21, a lead frame 22, an electronic chip 23 with two horizontal Hall elements 24, 25, an insulating layer 26 and a plastics housing 27. The current conductor 20 is provided with guide holes 28 for self-adjusting production. For the purposes of increasing the magnetic field strength the current conductor 20 is designed with a reduced-width portion 29 in the region of the Hall elements 24, 25. In addition, outside the housing 27, the current conductor 20 has two holes 30 which can be provided with connecting terminals for an electric conductor whose current is to be measured with the current sensor 19. The lead frame is designed with connecting legs 31 which serve for electrical contacting of the chip 23. The yoke 21 embraces the current conductor 20 on three sides. The insulating layer 26 and the chip 23 are disposed on the fourth side of the current conductor 20. The Hall elements 24 and 25 are so positioned on the chip 23, according to the dimensions of the current conductor 20 and the yoke 21, that they are in the region of maximum strength of the magnetic field B which is produced by a current 1 flowing through the current conductor 20. The current sensor 19 can be produced using conventional IC-technology. It is in the form of an integrated component with a plastics housing, wherein besides the connecting legs 31 which look like conventional pins, there are two parts of the current conductor 20, which project out of the plastics housing 27, for the direct connection of conductor wires.

The thickness of the current conductor 20 is typically a few tenths of a millimeter or a full millimeter. Heat is produced in the reduced-width portion 29, in operation of the current sensor 19, and that heat has to be conducted away to the exterior and to the surroundings by way of the non-reduced portion so that the current sensor 19 is not increased in temperature above a temperature which destroys it. The current conductor 20 can also be in the form of a lead frame so that the current sensor 19 can be produced with the 2-lead frame technology known from the production of power transistors. It is also possible to provide cooling bodies which are connected to the current conductor 20 by way of the housing 27 so that the reduced-width portion 29 can be kept very narrow and the heat generated at the maximum permissable current in the current conductor 20 can nonetheless be carried off without the current sensor 19 being damaged.

The yoke 21 advantageously comprises a nickel-iron alloy, for example Mumetal or Permalloy. The current conductor 20 preferably comprises copper.

The current sensor 19 is insensitive to external magnetic interference fields as the first Hall element 24 and the second Hall element 25 detect such an interference field with a reversed sign as they each supply a positive Hall voltage when the magnetic fields passing through them are in different directions. By virtue of that insensitivity to interference fields such a current sensor 19 is particularly suitable for measuring very low currents.

In another embodiment of the current sensor 19 the yoke 21 is omitted and the two Hall elements 24 and 25 are replaced by a single Hall element like that shown in FIG. 5b. In that case the Hall element may or may not be provided with the flux concentrators. The dimensions of the current conductor 19 are matched to the geometry of the Hall element and possibly of the flux concentrators.

Figure 8:
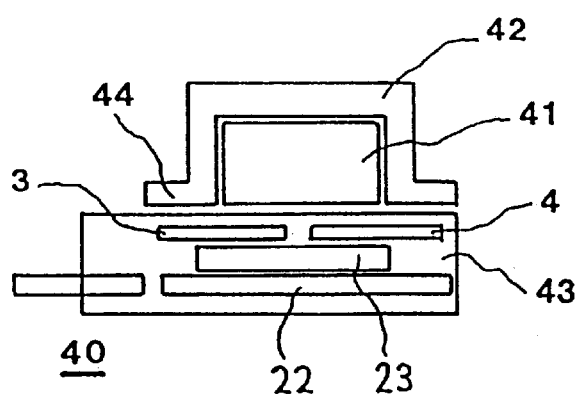
FIG. 8 is a plan view of a further current sensor.
Figure 9:
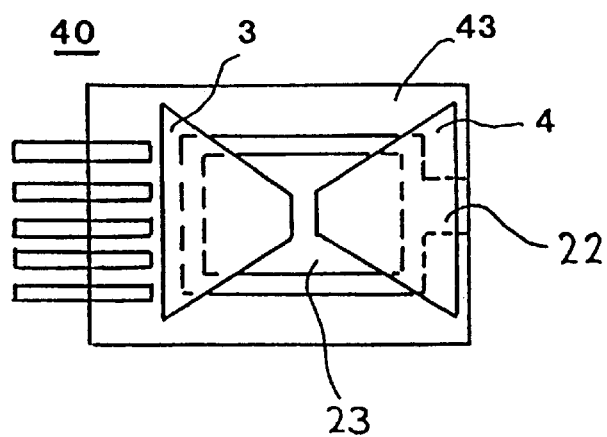
FIG. 9 shows the further current sensor in cross-section.

FIGS. 8 and 9 are a plan view and a view in cross-section of a current sensor 40 which is designed for measuring high currents. The current sensor 40 comprises three parts which can be produced separately: a current conductor 41, a ferromagnetic yoke 42 and a magnetic field sensor 43. The magnetic field sensor 43 is of the type of magnetic field sensor 1 shown for example in FIG. 1. It is in the form of an IC-component in which the flux concentrators 3, 4 are also integrated, besides the Hall elements 1, 2 (FIG. 2) or the Hall element 12 (FIG. 4). The yoke 42 encloses the rectangular current conductor 41 on three sides while the fourth side is covered by the magnetic field sensor 43. The yoke 42 is preferably provided with laterally extending feet 44 and is glued to the magnetic field sensor 43. The yoke 42 and the flux concentrators 3, 4 in the magnetic field sensor 43 are matched to each other as they form a magnetic circuit which carries the magnetic field generated by the current flowing in the conductor 41. In particular the two air gaps between the yoke 42 and the flux concentrators 3 and 4 respectively are as small as possible.

The current sensors 19 and 40 can also be in the form of energy sensors when they are of the same geometrical structure and with suitable electrical adaptation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A magnetic field sensor having two flux concentrators and a Hall element for measuring a magnetic field, said Hall element being fixed in space in regard to said flux concentrators, wherein the flux concentrators are separated by an air gap, and wherein the Hall element is arranged outside the air gap and at least a part of the field lines of the magnetic field, which lead from the first flux concentrator to the second flux concentrator, passes through the Hall element in approximately opposite directions, such that the magnetic field passing through the Hall elements adds one of a positive or negative voltage to a Hall voltage of said Hall element.

2. A magnetic field sensor according to claim 1 wherein the current and voltage electrodes of the Hall element are arranged along a notional straight line, said straight line extending along the air gap between the flux concentrators and approximately perpendicularly to the field lines of the magnetic field within the air gap.

* * * * *